(12) United States Patent
Bhatia et al.

(10) Patent No.: US 6,806,793 B2
(45) Date of Patent: Oct. 19, 2004

(54) MLC FREQUENCY SELECTIVE CIRCUIT STRUCTURES

(75) Inventors: Harsaran S. Bhatia, Hopewell Junction, NY (US); Harvey C. Hamel, Poughkeepsie, NY (US); David C. Long, Wappingers Falls, NY (US); Edward R. Pillai, Wappingers Falls, NY (US); Christopher D. Setzer, Poughkeepsie, NY (US); Benjamin P. Tongue, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/318,933

(22) Filed: Dec. 13, 2002

(65) Prior Publication Data

US 2004/0113721 A1 Jun. 17, 2004

(51) Int. Cl.[7] .............................................. H03H 11/04
(52) U.S. Cl. ........................ 333/175; 333/185; 336/200
(58) Field of Search ............................... 333/172, 175, 333/184, 185; 336/200

(56) References Cited

U.S. PATENT DOCUMENTS

| | | | |
|---|---|---|---|
| 3,731,005 A | 5/1973 | Shearman | 360/123 |
| 3,812,442 A | 5/1974 | Muckelroy | 336/83 |
| 3,947,934 A | 4/1976 | Olson | 29/25.42 |
| 5,384,434 A | 1/1995 | Mandai et al. | 174/258 |
| 5,425,166 A | 6/1995 | Hastings et al. | 29/602.1 |
| 5,499,005 A | 3/1996 | Gu et al. | 333/246 |
| 5,610,569 A * | 3/1997 | Hwang et al. | 336/200 |
| 6,002,593 A * | 12/1999 | Tohya et al. | 361/765 |
| 6,008,102 A * | 12/1999 | Alford et al. | 438/381 |
| 6,008,151 A | 12/1999 | Sasaki et al. | 501/17 |
| 6,054,914 A | 4/2000 | Abel et al. | 336/200 |
| 6,114,937 A * | 9/2000 | Burghartz et al. | 336/200 |
| 6,153,290 A | 11/2000 | Sunahara | 428/210 |
| 6,200,405 B1 | 3/2001 | Nakazawa et al. | 156/248 |
| 6,207,234 B1 | 3/2001 | Jiang | 427/333 |
| 6,329,890 B1 | 12/2001 | Brooks et al. | 333/204 |
| 6,351,033 B1 * | 2/2002 | Lotfi et al. | 257/724 |
| 6,605,857 B2 * | 8/2003 | Wong et al. | 257/531 |

* cited by examiner

*Primary Examiner*—Robert Pascal
*Assistant Examiner*—Dean Takaoka
(74) *Attorney, Agent, or Firm*—Scully, Scott, Murphy & Presser; H. Daniel Schnurmann, Esq.

(57) ABSTRACT

MLC (multilayer ceramic) frequency selective circuit structures are disclosed. The MLC frequency selective circuit structures have a solenoid and toroid coil geometry in a multilayer electronic package which functions as a frequency selective tuned circuit in which both the number of turns and the aspect ratio of the solenoid coil are selected to adjust the tuned frequency. In some embodiments, a plurality of such coils can be connected together to provide a selected bandwidth about a tuned center frequency.

24 Claims, 3 Drawing Sheets

MLC FREQUENCY SELECTIVE CIRCUIT STRUCTURES

BACKGROUND OF THE INVENTION

The present invention relates generally to MLC (multilayer ceramic) frequency selective circuit structures. More particularly, the subject invention pertains to MLC frequency selective circuit structures having a solenoid and toroid coil geometry in a multilayer electronic package which functions as a frequency selective tuned circuit in which both the number of turns and the aspect ratio of the solenoid coil are selected to adjust the tuned frequency. In some embodiments, a plurality of such coils can be connected together to provide a selected bandwidth about a tuned center frequency.

The prior art has generally provided a tuned circuit by mounting inductors and capacitors on a semiconductor MMIC (monolithic microwave integrated circuit), on a package, or on a PCB (printed circuit board).

SUMMARY OF THE INVENTION

The present invention provides a solenoid and toroid coil geometry in a multilayer electronic package which functions as a frequency selective tuned circuit. Both the number of turns and the aspect ratio of the solenoid coils can be selected to adjust the tuned frequency. In some embodiments, a plurality of such coils can be connected together to provide a selected bandwidth about a tuned center frequency.

The frequency selective tuned circuits of the present invention can be extended to semiconductor MMICs (monolithic microwave integrated circuits), PCBs (printed circuit boards), and other packaging configurations.

The present invention provides MLC frequency selective structures that take advantage of MLC characteristics. An MLC frequency selective circuit is a structure that can be integrated into an MLC package using conventional MLC manufacturing techniques and that combines an inductive effect and a capacitive effect as an integrated entity which functions as a frequency dependent circuit. The dimensions of the structure can be selected to determine a) capacitance and inductance, b) the tuned frequency at which resonance occurs, c) the bandwidth, and d) the energy storage capability (Q) at that frequency. The toroidal and wide-link solenoidal geometries of the present invention have inherently much higher Qs than many other structures. Also more than one such coil can be connected together to further adjust parameters such as the bandwidth about the selected tuned frequency. Such circuits can also form part of a larger circuit including active devices and other passive devices to provide electrical functions such as amplification, oscillation, filtering, impedance matching, etc.

BRIEF DESCRIPTION OF THE DRAWINGS

The foregoing objects and advantages of the present invention for MLC frequency selective circuit structures may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

Although multilayer ceramic (MLC) technology is not widely used in radio frequency (RF), microwave frequency (MF) and analog systems, MLC structures offer possible unique opportunities for such systems. Frequency selective circuits are often used in RF and MF systems to provide frequency discrimination, filtering, isolation and impedance matching, and MLC technology can be used to provide MLC frequency selective structures for such systems. Frequency selective circuit structures can be thought of conceptually as a capacitive component and an inductive component connected in series or in parallel. Selecting the values for the capacitive and inductive components determines the resonant frequency for the structure.

The present invention provides MLC frequency selective structures that take advantage of MLC characteristics. An MLC frequency selective circuit is a structure that can be integrated into an MLC package using conventional MLC manufacturing techniques and that combines an inductive effect and a capacitive effect as an integrated entity which functions as a frequency dependent circuit. The amount of inductance and capacitance can be easily controlled to provide a given frequency range. The selected dimensions of the structure determine the selected tuned frequency at which resonance occurs.

An MLC tuned circuit can be integrated into a ceramic chip carrier to provide shorter signal paths, resulting in higher resonance frequencies and higher Qs. The process to provide an MLC tuned circuit can use the same material set that is currently being used in conventional MLC manufacturing processes, such that the cost of fabricating an MLC tuned circuit would be lower.

The MLC tuned circuit structures of the present invention can be used in a variety of radio frequency (RF) and microwave frequency (MF) circuit applications, such as for filter circuits and oscillator circuits.

Figure 1:
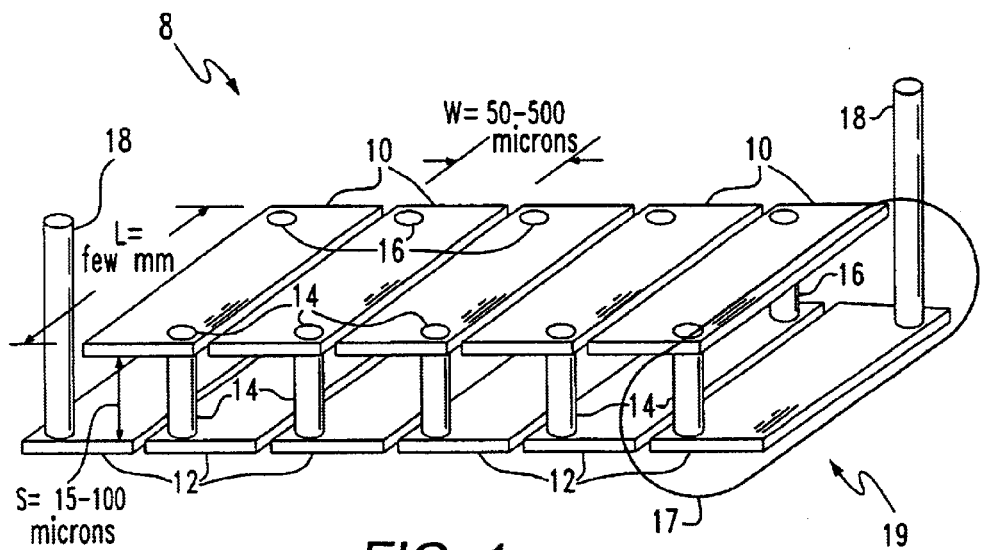
FIG. 1 illustrates a first embodiment of the present invention for an MLC tuned circuit wherein first and second pluralities of rectangular shaped metal segments are positioned in respective first upper and a second lower planes, and are offset slightly widthwise with respect to each other.

FIG. 1 illustrates a first embodiment of the present invention for an MLC frequency selective tuned circuit 8 in a solenoid structure that can be embedded into a multilayer packaging structure. A first plurality of rectangular shaped metal segments or lines 10 are positioned in a first upper plane formed by the illustrated flat surfaces of the first plurality of rectangular shaped metal segments or lines 10, and a second plurality of rectangular shaped metal segments or lines 12 are positioned in a second lower plane formed by the illustrated flat surfaces of the second plurality of rectangular shaped metal segments or lines 12, and are staggered or offset slightly widthwise with respect to the first plurality of rectangular shaped metal segments. In this staggered offset arrangement, a metal via 14 on the right side of the forward end of each of the first plurality of rectangular shaped metal segments extends downwardly to connect to the left side of the forward end of each of the second plurality of metal segments, and a metal via 16 on the left side of the rearward end of each of the first plurality of rectangular shaped metal segments extends downwardly to connect to the right side of the rearward end of each of the second plurality of metal segments. The open left side of the forward end of the leftmost second plurality of rectangular metal segments and the open right side of the rearward end of the rightmost second plurality of rectangular metal segments support a longer metal via 18 which extends upwardly to connect to further structures such as further pluralities of rectangular metal segments. The first and second pluralities of rectangular metal segments form a ceramic chip coil structure, which in a preferred embodiment is embedded or potted in a high Q packaging material shown schematically at 17 to provide an energy storage capability in a multilayer integrated MLC (multiplayer ceramic) package 19.

The first top conductive segments/lines and second bottom conductive segments/lines together with the vertical metal vias complete the MLC frequency selective circuit structure. The dimensions are typically designed to satisfy cross sectional and length requirements to achieve a target resonance frequency. The line widths of the first top and second bottom structures are selected as part of the circuit design to determine the resonance frequency and to control the Q of the resonant circuit by providing a designed capacitive effect and a designed inductive effect. The resultant MLC structure is an intermediate structure between a simple coil and capacitor and a resonant cavity that can be considered to be a simple coil at one extreme and a resonant cavity at the other extreme. The first top conductors permit tuning adjustments to be made by trimming accessible conductors. The resonant frequency is dependent upon the cross-section and the length of the structure. The MLC frequency-selective circuit can be built in the ceramic material set currently being used in manufacturing other MLC circuit structures. Complex driving impedance of the Foster first canonical form can be directly constructed from the form.

In envisioned embodiments, a typical metal segment could be formed of a layer of copper patterned on a ceramic sheet or substrate, and have a length L of a few millimeters and a width W of 50–500 microns, with the spacing S between the upper and lower metal segments being 15–100 microns, and the upper and lower metal segments being separated by 1 to 5 layers of ceramic having holes punched therethrough for the vias.

Figure 2:
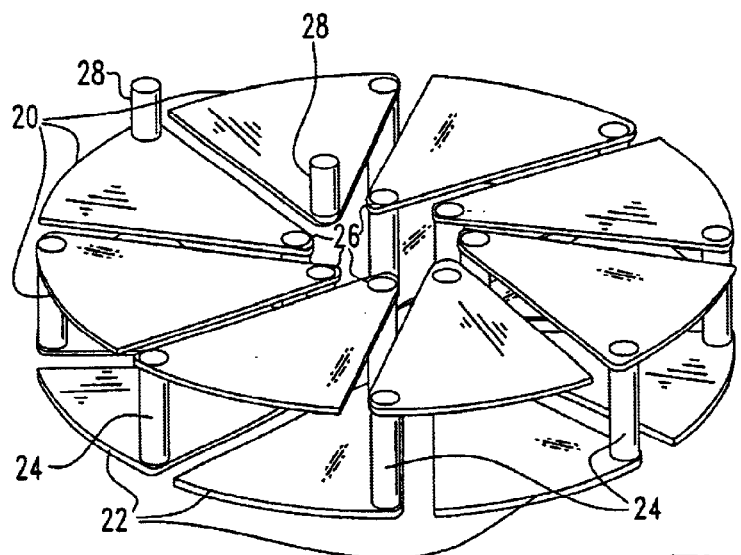
FIG. 2 illustrates a second embodiment of the present invention for an MLC tuned circuit wherein first and second pluralities of triangular shaped metal segments in first and second spaced planes are offset slightly circumferentially with respect to each other.

FIG. 2 illustrates a second embodiment of the present invention for an MLC tuned circuit wherein first and second pluralities of triangular shaped metal segments 20, 22 in first and second spaced planes are offset slightly circumferentially with respect to each other, and are interconnected by metal vias. The tuned frequency of the tuned circuit is selected by selecting the shape and dimensions of the metal segments.

A metal via 24 at the clockwise circumferential end of each of the first plurality of triangular segments connects to the counterclockwise circumferential end of each of the second plurality of triangular segments, and a metal via 26 at the inner radial end of each of the first plurality of triangular segments connects to the overlapped inner radial end of each of the second plurality of triangular segments. A first via 28 extends upwardly from one terminal outer circumferential end of the assembly, and a second via 28 extends upwardly from a second terminal inner radial end of the assembly, to connect to further assemblies similar to FIG. 1.

In a preferred embodiment, packaging material is placed over the chip (silicon) material to embed the coil structure to provide a higher Q (ability to store energy) of the material. It is also possible to boost Q and have greater flexibility in adjusting parameters such as the bandwidth about the frequency of selection by directly connecting more than one coil together. This can be achieved by indirect connections using capacitive and inductive coupling techniques between coils. Impedance matching and DC isolation between active devices can also be attained this way.

Figure 3:
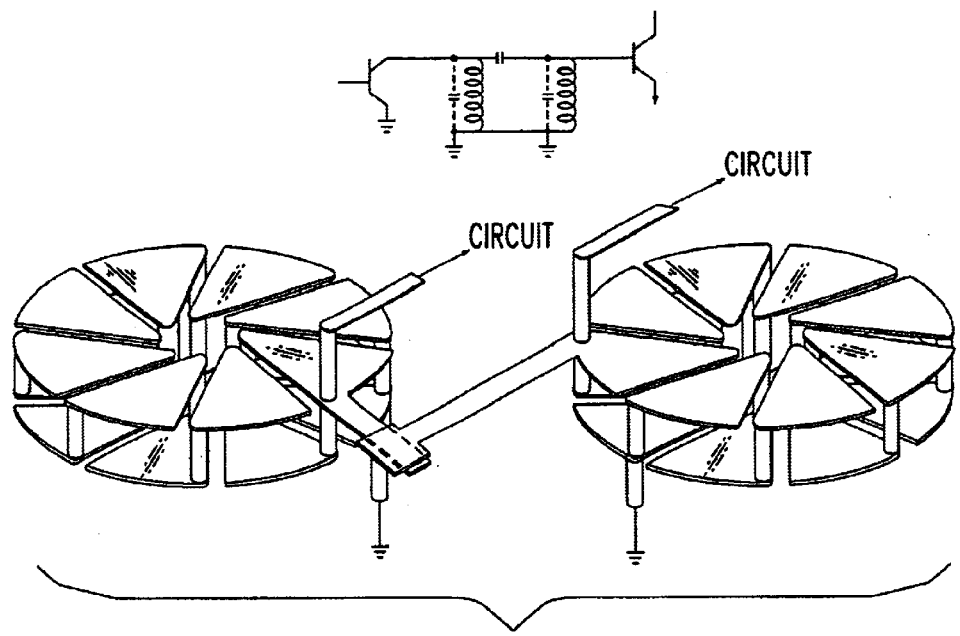
FIGS. 3, 4 and 5 show respectively how toroids can be connected for capacitive coupling, inductive link coupling and inductive proximity coupling, and also illustrate circuit diagrams describing the coupling mechanisms and possible application with transistors.
Figure 4:
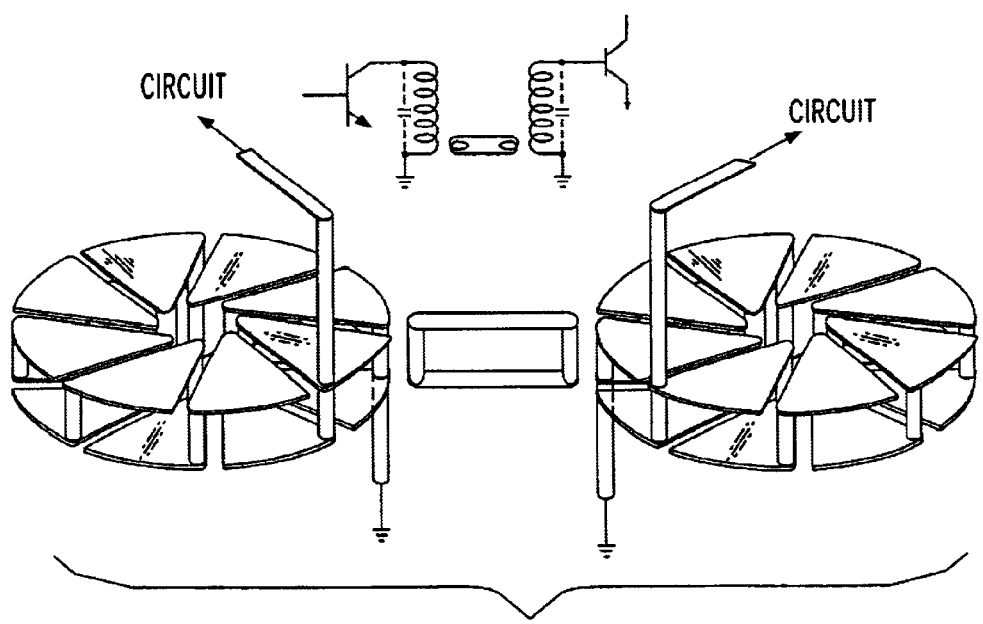
Figure 5:
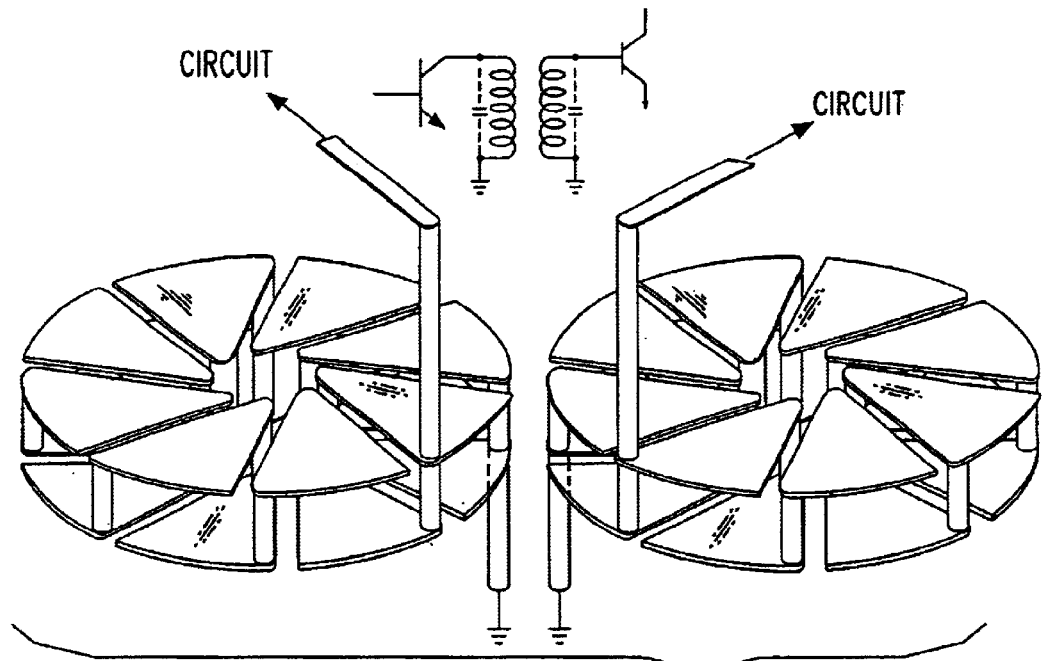

FIGS. 3, 4 and 5 show respectively how toroids can be connected for capacitive coupling, inductive link coupling and inductive proximity coupling, and also illustrate circuit diagrams describing the coupling mechanisms and possible application with transistors. A plurality of solenoid coil configurations form a basic elemental coil as a fundamental frequency selective network and then derivatives can be formed, i.e. 2 in series—bandpass, coupled coils-bandpass, transformers.

Figure 6:
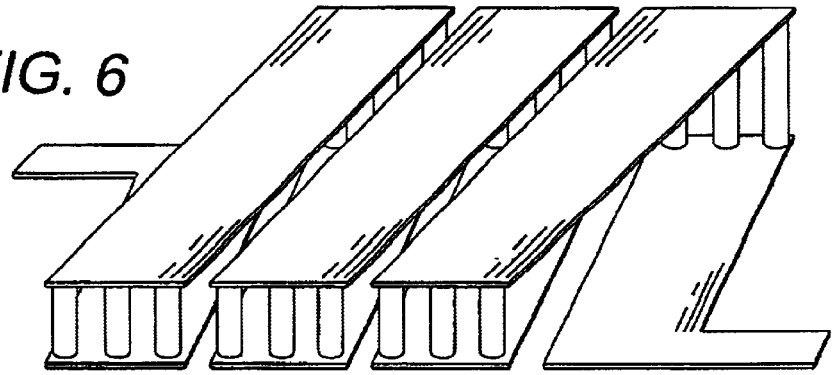
FIG. 6 illustrates that the solenoidal coil can be also designed with a large number of vias to increase the Q, to attain higher performance at the selected resonant frequency of the circuit.

FIG. 6 illustrates that the solenoidal coil can be also designed with a large number of vias to increase the Q, to attain higher performance at the selected resonant frequency of the circuit.

Figure 7:
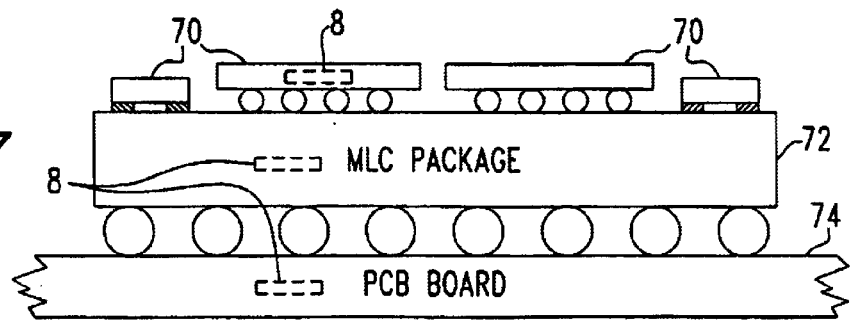
FIG. 7 illustrates a plurality of chips mounted on an MLC package which is in turn mounted on a PCB board.

FIG. 7 illustrates a plurality of chips 70 mounted on an MLC package 72 which is in turn mounted on a PCB board 74. The frequency selective tuned circuits 8 of the present invention could be used in any one or all of the chips 70, the MLC package 72 and the PCB board 74.

The frequency selective tuned circuits of the present invention can be extended to semiconductor MMICs (monolithic microwave integrated circuits), PCBs (printed circuit boards), and other packaging configurations.

While several embodiments and variations of the present invention for MLC frequency selective circuit structures are described in detail herein, it should be apparent that the disclosure and teachings of the present invention will suggest many alternative designs to those skilled in the art.

What is claimed is:

1. A multilayer ceramic (MLC) frequency selective circuit that combines an inductive effect and a capacitive effect in an integrated structure which functions as a frequency dependent circuit, comprising:

a multilayer ceramic structure defining at least first and second spaced planes, the first and second spaced planes containing respectively a first and second plurality of metal shaped segments;

the metal shaped segments are rectangular in shape, and each metal shaped segment has a length of a few millimeters and a width of 50–500 microns, with the spacing between the metal shaped segments in the first and second planes being 15–100 microns, and the upper and lower metal shaped segments being separated by one or more layers of ceramic having holes formed therethrough for the vias;

a plurality of conductive vias connecting the first plurality of metal shaped segments in the first plane with the second plurality of metal shaped segments in the second spaced plane, thereby forming a conductive solenoid coil structure in a multilayer ceramic frequency selective circuit.

2. The MLC frequency selective circuit of claim 1, wherein the dimensions of the MLC circuit and of the metal shaped segments are selected to produce a particular center resonant frequency.

3. The MLC frequency selective circuit of claim 1, wherein the first plurality of rectangular shaped metal segments are positioned offset widthwise with respect to the second plurality of rectangular shaped metal segments.

4. The MLC frequency selective circuit of claim 3, wherein a via on a right side of a forward end of each of the first plurality of rectangular shaped metal segments extends downwardly to connect to a left side of a forward end of each of the second plurality of rectangular shaped metal segment, and a via on a left side of a rearward end of each of the first plurality of rectangular shaped metal segments extends downwardly to connect to a right side of a rearward end of each of the second plurality of rectangular shaped metal segments.

5. The MLC frequency selective circuit of claim 1, wherein a plurality of solenoid coils are connected together for inductive proximity coupling.

6. The MLC frequency selective circuit of claim 1, wherein the MLC frequency selective circuit is in a semiconductor chip.

7. The MLC frequency selective circuit of claim 1, wherein the MLC frequency selective circuit is in a multilayer ceramic package.

8. The MLC frequency selective circuit of claim 1, wherein the MLC frequency selective circuit is in a printed circuit board.

9. The MLC frequency selective circuit of claim 1, wherein the MLC circuit is embedded and potted in a high Q packaging material to provide a high Q energy storage capability in a multilayer integrated MLC package.

10. The MLC frequency selective circuit of claim 1, wherein each metal shaped segment is formed of a layer of metal patterned on a ceramic sheet.

11. The MLC frequency selective circuit of claim 1, wherein a plurality of the solenoid coils are connected together to provide a selected bandwidth about a center resonant frequency.

12. The MLC frequency selective circuit of claim 1, wherein a plurality of solenoid coils are connected together for capacitive coupling.

13. The MLC frequency selective circuit of claim 1, wherein a plurality of solenoid coils are connected together for inductive link coupling.

14. A multilayer ceramic (MLC) frequency selective circuit that combines an inductive effect and a capacitive effect in an integrated structure which functions as a frequency dependent circuit, comprising:

a multilayer ceramic structure defining at least first and second spaced planes, the first and second spaced planes containing respectively a first and second plurality of metal shaped segments;

substantially all of the metal shaped segments are triangular in shape, and form a toroidal shaped coil structure having a substantially round circumferential shape, wherein each triangular shaped segment has an inner radial triangular corner positioned adjacent to and pointing towards the middle of the toroidal shaped coil structure to form the toroidal shaped coil structure, and the inner radial triangular corners of the first plurality of triangular shaped segments overlap the inner radial triangular corners of the second plurality of triangular shaped segments, and the outer radial triangular sides of the first plurality of triangular shaped segments are circumferentially rotated and offset with respect to the outer radial triangular sides of the second plurality of triangular shaped segments;

a plurality of conductive vias connecting the first plurality of triangular shaped metal shaped segments in the first plane with the second plurality of triangular shaped metal shaped segments in the second spaced plane, wherein a via at a clockwise circumferential end of the outer radial triangular side of each of the first plurality of triangular segments connects to a counterclockwise circumferential end of the outer radial triangular side of each of the second plurality of triangular segments, and a via at the inner radial triangular corner of each of the first plurality of triangular segments connects to the overlapped inner radial triangular corner of each of the second plurality of triangular segments, thereby forming a conductive toroidal shaped coil structure in a multilayer ceramic frequency selective circuit.

15. The MLC frequency selective circuit of claim 14, wherein a plurality of solenoid coils are connected together for inductive proximity coupling.

16. The MLC frequency selective circuit of claim 14, wherein the MLC frequency selective circuit is in a semiconductor chip.

17. The MLC frequency selective circuit of claim 14, wherein the MLC frequency selective circuit is in a multilayer ceramic package.

18. The MLC frequency selective circuit of claim 14, wherein the MLC frequency selective circuit is in a printed circuit board.

19. The MLC frequency selective circuit of claim 18, wherein the dimensions of the MLC circuit and of the metal shaped segments are selected to produce a particular center resonant frequency.

20. The MLC frequency selective circuit of claim 18, wherein the first plurality of triangular shaped metal segments are positioned offset circumferentially with respect to the second plurality of triangular shaped metal segments.

21. The MLC frequency selective circuit of claim 14, wherein a plurality of solenoid coils are connected together for inductive link coupling.

22. The MLC frequency selective circuit of claim 14, wherein the MLC circuit is embedded and potted in a high Q packaging material to provide a high Q energy storage capability in a multilayer integrated MLC package.

23. The MLC frequency selective circuit of claim 14, wherein a plurality of the solenoid coils are connected together to provide a selected bandwidth about a center resonant frequency.

24. The MLC frequency selective circuit of claim 14, wherein a plurality of solenoid coils are connected together for capacitive coupling.

* * * * *